(12) United States Patent
Bowles et al.

(10) Patent No.: US 9,165,886 B2
(45) Date of Patent: Oct. 20, 2015

(54) SENSOR PACKAGING METHOD AND SENSOR PACKAGES

(71) Applicant: FREESCALE SEMICONDUCTOR, INC., Austin, TX (US)

(72) Inventors: Philip H. Bowles, Gilbert, AZ (US); Paige M. Holm, Phoenix, AZ (US); Stephen R. Hooper, Mesa, AZ (US); Raymond M. Roop, Scottsdale, AZ (US)

(73) Assignee: FREESCALE SEMICONDUCTOR,INC, Austin, TX (US)

( * ) Notice: Subject to any disclaimer, the term of this patent is extended or adjusted under 35 U.S.C. 154(b) by 0 days.

(21) Appl. No.: 14/151,305

(22) Filed: Jan. 9, 2014

(65) Prior Publication Data

US 2014/0124958 A1 May 8, 2014

Related U.S. Application Data

(62) Division of application No. 13/597,824, filed on Aug. 29, 2012, now Pat. No. 8,659,167.

(51) Int. Cl.
*H01L 23/528* (2006.01)
*B81C 1/00* (2006.01)

(52) U.S. Cl.
CPC ............ *H01L 23/528* (2013.01); *B81C 1/0023* (2013.01); *B81C 1/00238* (2013.01); *B81C 2201/019* (2013.01); *B81C 2203/0792* (2013.01); *H01L 2224/48091* (2013.01); *H01L 2924/1461* (2013.01)

(58) Field of Classification Search
CPC ................. H01L 2924/00; H01L 2224/73265; H01L 2924/00014; H01L 2224/48227; H01L 2224/32225; H01L 23/528
USPC .......................... 257/777, 417, 418, 415, 718
See application file for complete search history.

(56) References Cited

U.S. PATENT DOCUMENTS

| | | | |
|---|---|---|---|
| 6,838,776 | B2 | 1/2005 | Leal et al. |
| 6,921,975 | B2 | 7/2005 | Leal et al. |
| 7,419,853 | B2 | 9/2008 | Kuhmann et al. |
| 7,446,017 | B2 | 11/2008 | Liu et al. |
| 7,858,440 | B2 | 12/2010 | Pressel et al. |

(Continued)

FOREIGN PATENT DOCUMENTS

| | | |
|---|---|---|
| WO | 02056031 A1 | 7/2002 |
| WO | 2007017757 A2 | 2/2007 |

*Primary Examiner* — Chuong A Luu
*Assistant Examiner* — Rodolfo Fortich
(74) *Attorney, Agent, or Firm* — Charlene R. Jacobsen

(57) ABSTRACT

A method (80) entails providing (82) a structure (117), providing (100) a controller element (102, 24), and bonding (116) the controller element to an outer surface (52, 64) of the structure. The structure includes a sensor wafer (92) and a cap wafer (94) Inner surfaces (34, 36) of the wafers (92, 94) are coupled together, with sensors (30) interposed between the wafers. One wafer (94, 92) includes a substrate portion (40, 76) with bond pads (42) formed on its inner surface (34, 36). The other wafer (94, 92) conceals the substrate portion (40, 76). After bonding, methodology (80) entails forming (120) conductive elements (60) on the element (102, 24), removing (126) material sections (96, 98, 107) from the wafers to expose the bond pads, forming (130) electrical interconnects (56), applying (134) packaging material (64), and singulating (138) to produce sensor packages (20, 70).

16 Claims, 10 Drawing Sheets

(56) References Cited

U.S. PATENT DOCUMENTS

| | | |
|---|---|---|
| 7,868,729 B2 | 1/2011 | Wang et al. |
| 8,124,435 B2 | 2/2012 | Kuisma |
| 8,154,126 B2 | 4/2012 | Voelz |
| 2006/0216857 A1 | 9/2006 | Zhao |
| 2009/0206422 A1 | 8/2009 | Illing et al. |
| 2010/0307247 A1 | 12/2010 | Weber |
| 2011/0018084 A1 | 1/2011 | Shim et al. |
| 2011/0221042 A1 | 9/2011 | Karlin et al. |
| 2011/0233621 A1 | 9/2011 | Liu et al. |
| 2011/0250721 A1 | 10/2011 | Bowles et al. |
| 2013/0207207 A1* | 8/2013 | McDonald et al. ........... 257/415 |

* cited by examiner

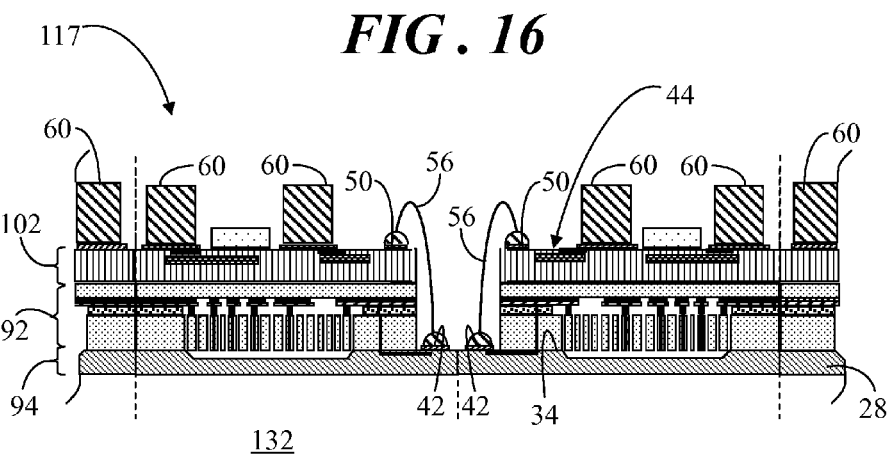
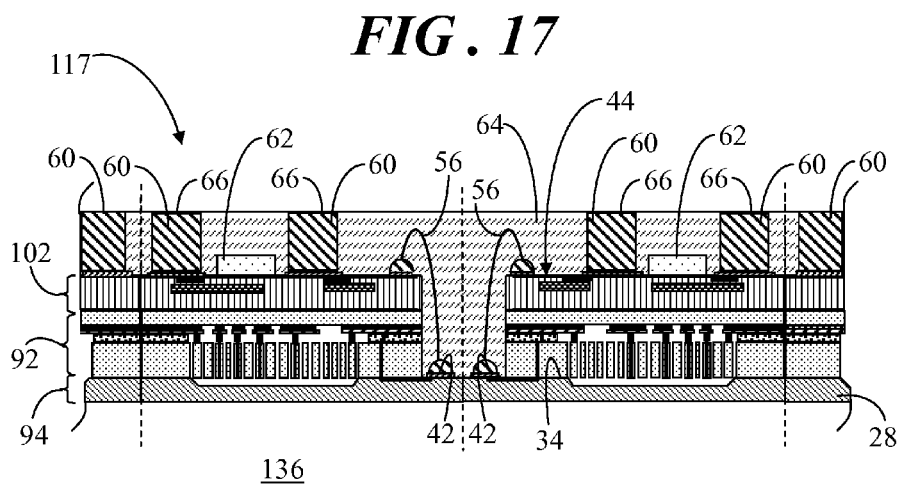
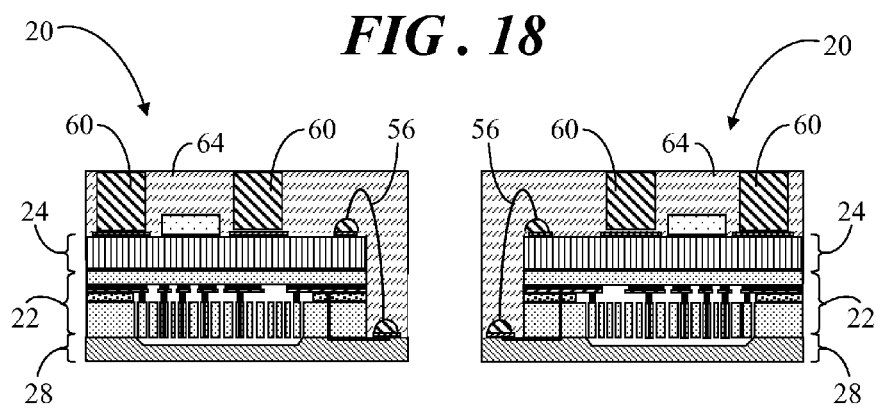

SENSOR PACKAGING METHOD AND SENSOR PACKAGES

TECHNICAL FIELD OF THE INVENTION

The present invention relates generally to semiconductor packaging. More specifically, the present invention relates to wafer level semiconductor packaging for forming sensor packages.

BACKGROUND OF THE INVENTION

Microelectronic device technology has achieved wide popularity in recent years, as it provides a way to make very small electronic and mechanical structures and integrate these structures on a single substrate using conventional batch semiconductor processing techniques. While such microelectronic devices are becoming mainstream technologies, cost effectively packaging them in semiconductor packages for manufacture and ease of use remains challenging.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

FIG. 16 shows a partial side sectional view of the stacked wafer structure of FIG. 15 at a subsequent stage of packaging;

FIG. 17 shows a partial side sectional view of the stacked wafer structure of FIG. 16 at a subsequent stage of packaging;

FIG. 18 shows a side sectional view of sensor packages produced from the stacked wafer structure of FIG. 17 in accordance with the packaging process of FIG. 4;

DETAILED DESCRIPTION

Figure 1:
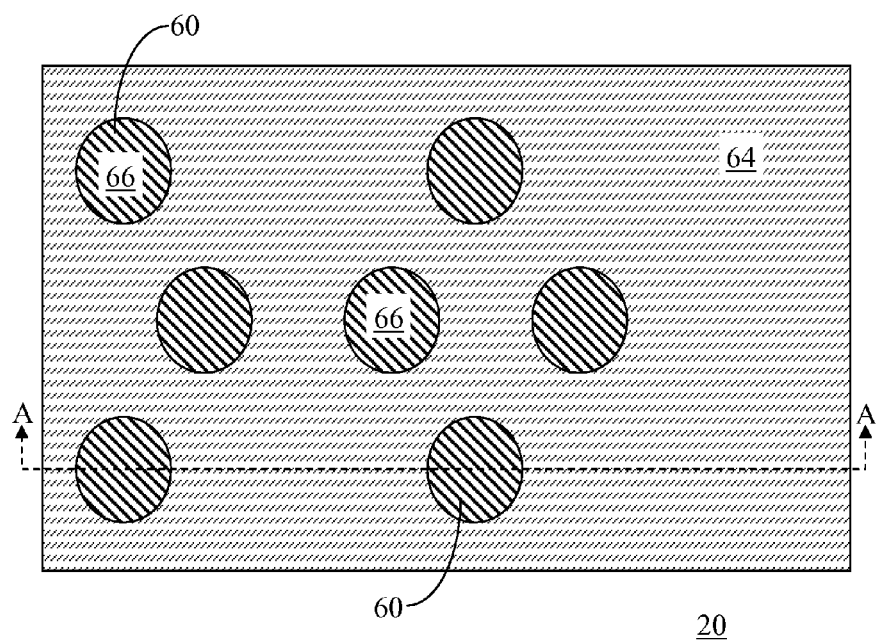
FIG. 1 shows a top view of an exemplary sensor package in accordance with an embodiment.

Semiconductor packages generally provide a set of related elements. These elements include, in some examples, one or more semiconductor devices to be packaged, interconnection from the devices to the package, a surrounding or containing structure to provide both mechanical support and electrical, chemical, and environmental protection, and a joining structure to attach the package to the board or system. The challenges faced by developers of semiconductor packaging processes result from, for example, the sensitivity of the semiconductor devices (e.g., microelectronics and microstructures) to high temperature processes, the need for suitable shielding, the requirement in some instances for a hermetic or near-hermetic seal to protect the devices from contaminants, and so forth. Due at least in part to these challenges, packaging is one of the major cost drivers for such devices.

One or more of the semiconductor devices in a semiconductor package may be a microelectronic sensor (e.g., a magnetometer), a microelectromechanical systems (MEMS) sensor (e.g., an accelerometer, gyroscope, pressure sensor), or some other miniaturized sensor. With regard to such sensors, proper packaging is important to ensure the integrity of the signals to and from the sensor devices. For example, angular misalignment of a sensor device or multiple sensor devices in a sensor package can lead to inaccuracies in the measured signals. As such, precise angular alignment of sensors in a sensor package is critical for receiving accurate measurements.

Angular alignment of sensors in traditional chip level packaging is currently limited to approximately plus or minus two degrees of accuracy. The angular alignment accuracy is limited by the tolerance of placement equipment utilized in die placement techniques. More precise angular alignment is being called for in the industry to improve the accuracy of measurements received from such sensors. As integrated circuit (IC) device geometries continue to decrease, the use of miniaturized sensor devices continues to rise, and the fabrication of semiconductor packages containing multiple microelectronic components continue to evolve, the need for low cost, accurate, reliable, high density packaging solutions increases.

Embodiments entail sensor packaging methodology and sensor packages produced in accordance with the packaging methodology. The packaging methodology involves a wafer-level packaging technique in lieu of traditional die-to-die placement techniques. Wafer-level packaging refers to packaging semiconductor devices at wafer level, and essentially extends the wafer fabrication process to include device interconnection and device protection processes. The wafer-level packaging process discussed herein provides high-throughput and precise placement packaging of sensors at relatively low cost. Additional advantages entail a chip-scale packaging technology that results in the sensor package being generally the same size as the die, stacking of sensors and microelectronic devices for size reduction, improved electrical performance, and so forth.

Figure 2:
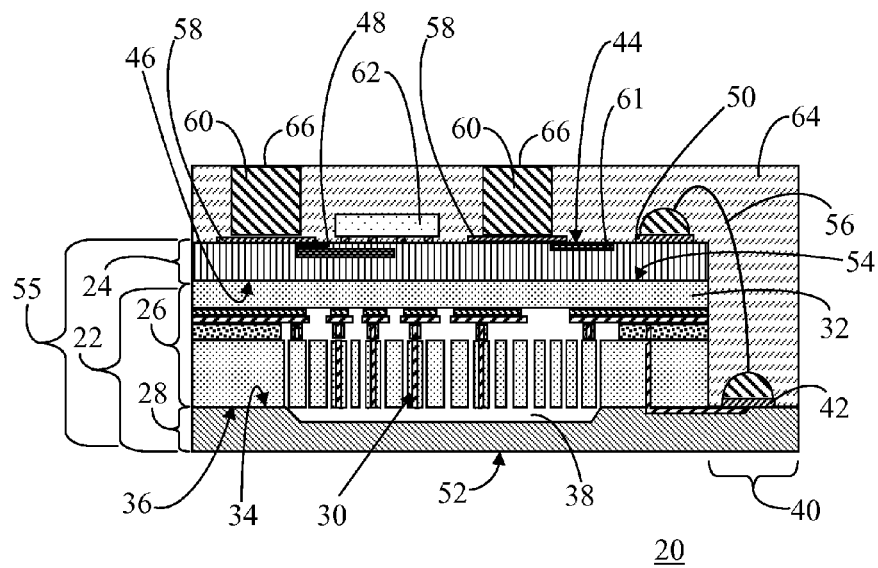
FIG. 2 shows a side view of the sensor package along section lines A-A in FIG. 1.

Referring now to FIGS. 1 and 2, FIG. 1 shows a top view of an exemplary sensor package 20 in accordance with an embodiment, and FIG. 2 shows a side view of sensor package 20 along section lines A-A in FIG. 1. In general, sensor package 20 includes a sensor structure 22 and a semiconductor die in the form of a controller element, referred to herein as a controller die 24 bonded to sensor structure 22. The various FIGS. 1-3 and 5-24 are illustrated using various shading and/or hatching to distinguish the different elements of the sensor packages for clarity of illustration. These different elements may be produced utilizing current and upcoming micromachining and/or semiconductor processing techniques.

Sensor structure 22 includes a sensor die 26, a cap 28, and a sensor 30 formed on or in a substrate material 32 of sensor die 26. An inner surface 34 of cap 28 is coupled to an inner surface 36 of sensor die 26 with sensor 30 being interposed between sensor die 26 and cap 28. Thus, inner surface 34 of cap 28 is referred to hereinafter as inner cap surface 34 and inner surface 36 of sensor die 26 is referred to hereinafter as inner die surface 36. Sensor 30 may be a microelectromechanical systems (MEMS) sensor device such as an accelerometer, gyroscope, or some other sensor. However, sensor 30 need not be limited to a MEMS sensor configuration. Rather, sensor 30 may be an optical device, electro-magnetic device, chemical device, or some other sensor device that contains micron and/or sub-micron sized components. Additionally, although sensor 30 is mentioned in singular form, in alternative embodiments, sensor die 26 may include more than one sensor device formed on or in substrate material 32.

Cap 28 generally covers sensor die 26 so as to encapsulate sensor 30. Cap 28 may include a cavity 38 extending inwardly from inner cap surface 34 so as to provide clearance for the moving elements of sensor 30, although such a configuration is not a limitation. Cap 28 may be attached to sensor die 26, for example, by a seal ring, so as to seal sensor 30 hermetically or near-hermetically within the encapsulated area. In the illustrated embodiment shown in FIG. 2, cap 28 includes a substrate portion 40 exposed from sensor die 26. That is, a material section of sensor die 26 does not cover, i.e., is absent from, substrate portion 40 of cap 28. Bond pads 42 are formed on inner cap surface 34 of cap 28 at substrate portion 40. Accordingly, bond pads 42 formed on inner cap surface 34 of cap 28 are located outside the area sealed by cap 28. Bond pads 42 may be electrically connected to various structures and/or electrodes of sensor 30 in accordance with conventional and evolving sensor device manufacturing processes. The electrical interconnections of bond pads 42 with the structures and/or electrodes of sensor 30 are not illustrated or described in detail herein for brevity of discussion.

Controller die 24 has a top side 44 and a bottom side 46 opposing top side 44. In FIG. 2, top side 44 is shown as being physically positioned above bottom side 46. Hence, the distinguishing terms "top" and "bottom" are utilized herein. Top side 44 includes control circuitry 48 and bond pads 50 formed thereon. Control circuitry 48 may be any active or passive circuitry used in the "active area" of controller die 24 for communicating signals to and from sensor 30.

Sensor structure 22 includes an outer surface 52 which corresponds to the outer, or external, surface of cap 28. Thus, outer surface 52 is referred to hereinafter as outer cap surface 52 for clarity. Sensor structure 22 further includes an opposing outer surface 54 which corresponds to the outer, or external, surface of sensor die 26. Thus, outer surface 54 is referred to hereinafter as outer die surface 54 for clarity. In the illustrated embodiment, bottom side 46 of controller die 24 is attached to outer die surface 54 of sensor structure 22 to produce a stacked structure 55 having sensor die 26 positioned between cap 28 and controller die 24.

In sensor structure 22, bond pads 42 on inner cap surface 34 of substrate portion 40 of cap 28 face in the same direction (i.e., upwardly in FIG. 2) as top side 44 of controller die 24 upon which bond pads 50 are located. Electrical interconnects, referred to herein as bond wires 56, are readily attached between corresponding bond pads 42 on inner cap surface 34 of cap 28 and bond pads 50 on top side 44 of controller die 24 to provide suitable electrical interconnections between controller die 24 and sensor die 26 of sensor structure 22.

Controller die 24 further includes bump pads 58 formed on and distributed across top side 44. In an embodiment, conductive elements 60 are formed on bump pads 58 after controller die 24 is bonded to sensor structure 22. Conductive elements 60 may be pillars, balls, plugs, or some other conductive features that extend above bump pads 58. Conductive elements 60 are illustrated in FIG. 1 as being a circular shape in cross-section. However, conductive elements 60 may have different shapes in cross-section in accordance with particular design criteria. Conductive elements 60 are utilized as input/output elements for sensor package 20.

In some embodiments, an integral sensor 61 may be formed integrally with the passive and active elements of control circuitry 48 within controller die 24 in accordance with conventional and upcoming semiconductor manufacturing processes. In lieu of, or in addition to, integral sensor 61, sensor package 20 may include a sensor die 62 mounted on top side 44 of controller die 24. In an embodiment, integral sensor 61 or sensor die 62 may be a magnetometer for measuring the strength or direction of magnetic fields. However, integral sensor 61 and/or sensor die 62 may be some other sensor device in accordance with particular design criteria for sensor package 20.

A packaging material 64 is applied over top side 44 of controller die 24 to encapsulate control circuitry 48, bond wires 56, sensor die 62, and to at least partially encapsulate conductive elements 60 so that only a top side 66 of conductive elements 60 is exposed from packaging material 64. Packaging material 64 may be any conventional molding compound such as, for example, an epoxy resin material.

Figure 3:
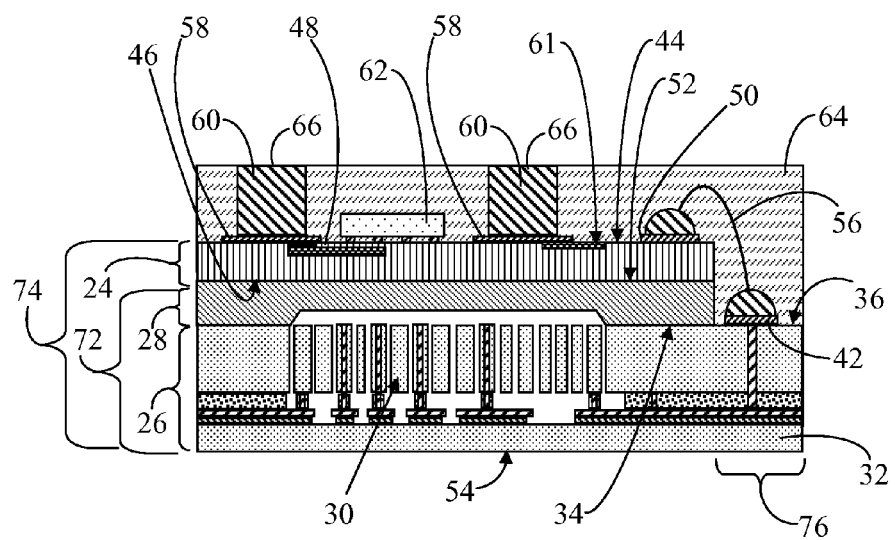
FIG. 3 shows a side view of a sensor package along section lines A-A in FIG. 1 in accordance with another embodiment.

FIG. 3 shows a side view of a sensor package 70 along section lines A-A in FIG. 1 in accordance with another embodiment. Sensor package 70 is similar to sensor package 20 (FIG. 2). Accordingly, sensor package 70 includes controller die 24 bonded to a sensor structure 72 to produce a stacked structure 74, where sensor structure 72 is made up of sensor die 26, cap 28, and sensor 30. Like sensor package 20, sensor package 70 additionally includes bond wires 56 electrically interconnecting sensor structure 72 with controller die 24, conductive elements 60, integral sensor 61 and/or sensor die 62, and so forth encapsulated by packaging material 64.

As particularly illustrated in FIG. 3, a distinguishing feature of sensor package 70 is that sensor die 26 includes a substrate portion 76 exposed from cap 28. That is, a material section of cap 28 does not cover, i.e., is absent from, substrate portion 76 of sensor die 26. Hence, in lieu of being formed on inner cap surface 34 of cap 28 (as shown in FIG. 2), bond pads 42 are formed on inner die surface 36 of sensor die 26 at substrate portion 76. Accordingly, bond pads 42 are located outside the area of sensor die 26 sealed by cap 28. As in the embodiment of FIG. 2, bond pads 42 may be electrically connected to various structures and/or electrodes of sensor 30 in accordance with conventional and evolving sensor device manufacturing processes. The electrical interconnections of bond pads 42 with the structures and/or electrodes of sensor 30 are not illustrated or described in detail herein for brevity of discussion.

Another distinguishing feature of sensor package 70, as also illustrated in FIG. 3, is that bottom side 46 of controller die 24 is attached to outer cap surface 52 of sensor structure 72 to produce stacked structure 74 having cap 28 positioned between sensor die 26 and controller die 24. Accordingly, bond pads 42 on inner die surface 36 of substrate portion 76 of sensor die 26 face in the same direction (i.e., upwardly in FIG. 3) as top side 44 of controller die 24 upon which bond pads 50 are located. Bond wires 56 are readily attached between corresponding bond pads 42 on inner die surface 36 of sensor die 26 and bond pads 50 on top side 44 of controller die 24 to provide suitable electrical interconnections between controller die 24 and sensor die 26 of sensor structure 72.

As discussed above, sensor package 20 (FIG. 2) represents a structural configuration in which sensor die 26 is interposed between cap 28 and controller die 24. Whereas, sensor package 70 represents a flipped structural configuration in which cap 28 is interposed between sensor die 26 and controller die 24. Sensor packages 20 and 70 are provided herein for exemplary purposes. However, the sensor packages may take on a wide variety of forms, sizes, shapes, and functions in accordance with particular design criteria.

Figure 4:
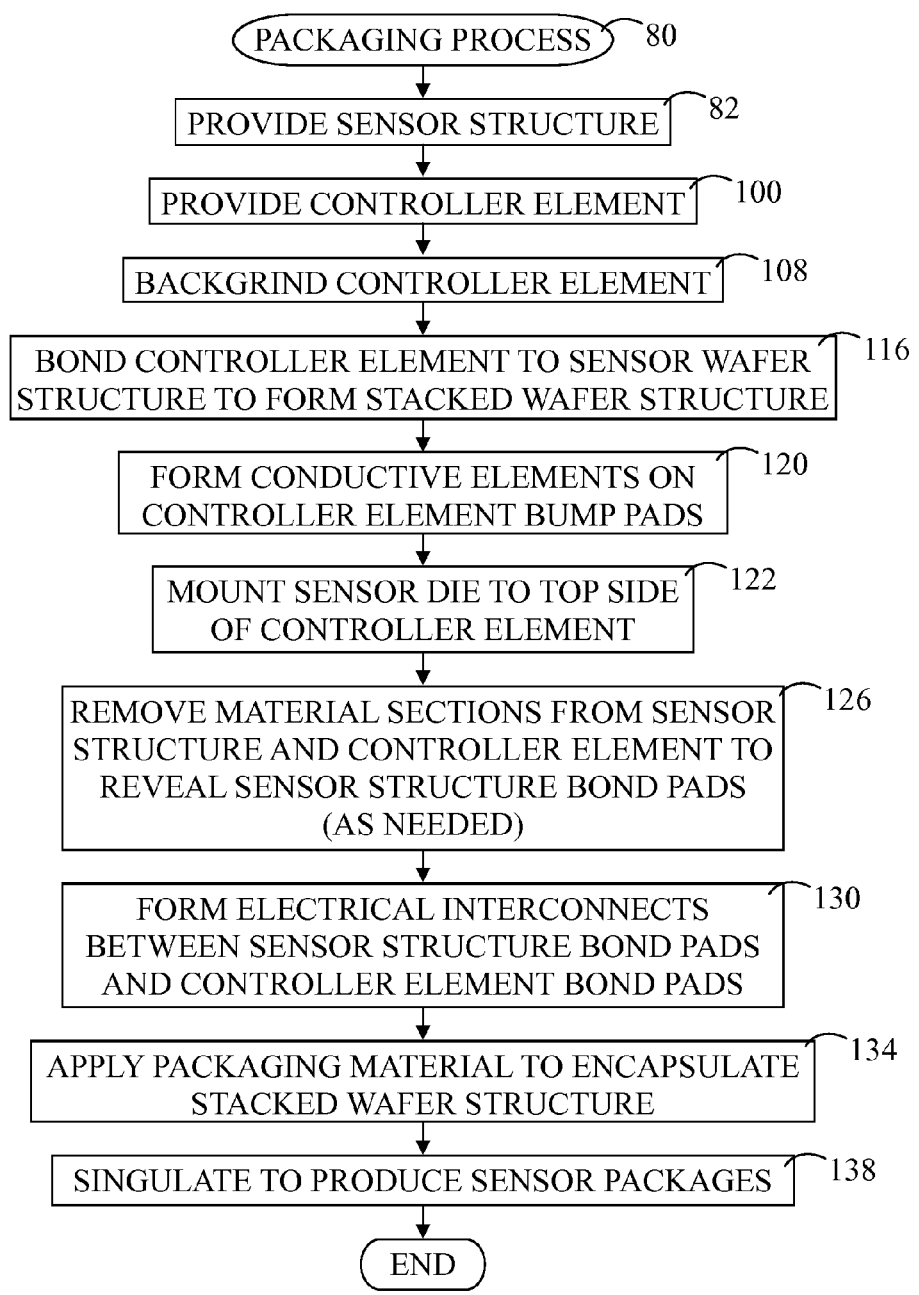
FIG. 4 shows a flowchart of a packaging process for fabricating the sensor packages of FIGS. 1-3.

FIG. 4 shows a flowchart of a packaging process 80 for fabricating sensor packages 20 and 70 (FIGS. 1-3) in accordance with another embodiment. Packaging process 80 sets forth a wafer-level packaging technique in which semiconductor elements are packaged while still in the wafer followed by wafer dicing, in lieu of traditional die placement techniques. Packaging process 80 will be discussed in connection with the packaging of a plurality of sensor packages 20 (FIG. 2) and in connection with the packaging of a plurality of sensor packages 70 (FIG. 3). However, it should become apparent that the following methodology can be adapted to packaging methodology for a multiplicity of semiconductor designs. Packaging process 80 sets forth an exemplary flow of operations for clarity of discussion. However, in actual practice there may be variations in the order of operations in accordance with particular processing capabilities of a packaging facility.

Packaging process 80 begins with an activity 82. At activity 82, a sensor wafer structure is provided with a multiplicity of sensors 30 (FIG. 2) formed thereon. The sensor wafer structure may be provided from a device manufacturer and packaged in accordance with packaging process 80 at a separate packaging facility. Alternatively, the sensor wafer structure may be fabricated and packaged within the same manufacturing facility.

Figure 5:
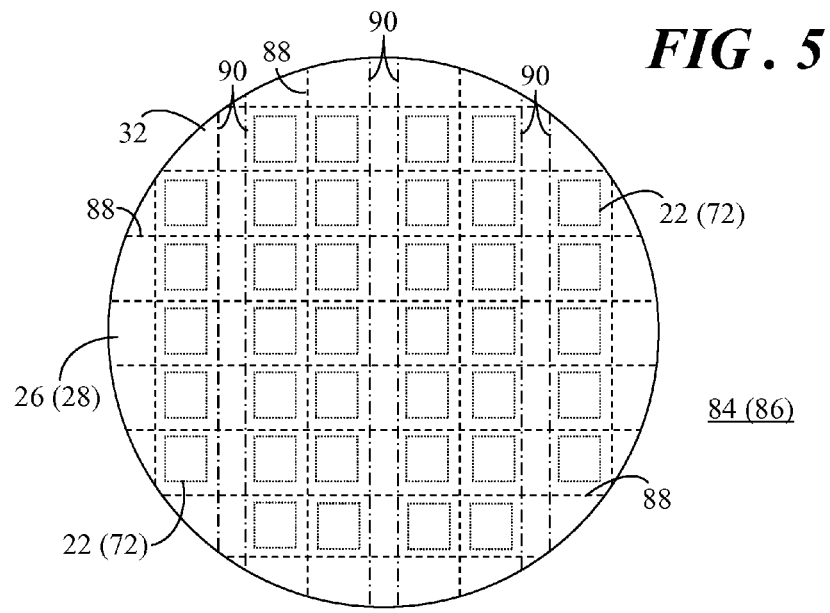
FIG. 5 shows a top view of a sensor wafer structure used in connection with the packaging process.

Referring to FIG. 5 in connection with activity 82, FIG. 5 shows a top view of a sensor wafer structure 84 used in connection with packaging process 90. FIG. 5 particularly illustrates an exemplary sensor wafer structure 84 which includes a plurality of sensor structures 22, represented by dotted lines, used to produce stacked structure 55 (FIG. 2) of sensor package 20 (FIG. 2). Thus, in the top view of sensor wafer structure 84, outer die surface 54 of sensor die 26 is visible.

Alternatively, the illustration of FIG. 5 can represent another sensor wafer structure 86. Sensor wafer structure 86 and its associated elements are distinguished by parentheses in FIG. 5. Like sensor wafer structure 84, sensor wafer 86 includes a plurality of sensor structures 72, represented by dotted lines, used to produce stacked structure 74 (FIG. 3) of sensor package 70 (FIG. 3). Thus, in the top view of sensor wafer structure 86, outer cap surface 52 of cap 28 is visible.

Sensor structures 22 and 72 may include any of a plurality of sensor devices such as inertial sensors, gyroscopes, optical devices, pressure sensors, magnetic field sensors, switches, microphones, and so forth. However, in alternative embodiments, sensor structures 22 and 72 may include any other device in which it is desirable to individually protect, i.e., cap, sensitive features and additionally expose or reveal terminal elements, i.e., bond pads 42 (FIG. 2) at the wafer level.

Sensor wafer structures 84 and 86 may be manufactured utilizing conventional and upcoming bulk micromachining, surface micromachining, and/or high aspect ratio silicon micromachining techniques. Fabrication processes for a surface micromachining technique can generally include, for example, deposition, patterning, and etching of one or more sacrificial oxide layers, one or more structural polysilicon layers, and the like. For example, one or more sacrificial oxide layers may be deposited overlying the silicon-based wafer, and one or more structural layers may then be deposited over the sacrificial layers.

All elements on either of sensor wafer structures 84 or 86 may be identical, or either of sensor wafer structures 84 or 86 can contain a mixture of sensor elements. Dashed lines 88 represent borders delineating the various sensor structures 22 that make up sensor wafer structure 84, or alternatively, the various sensor structures 72 that make up sensor wafer structure 86. Dashed lines 88 can additionally represent the locations at which sensor wafer structure 84 will eventually be sawn, diced, etched, or otherwise singulated (discussed below). Thus, dashed lines 88 are referred to hereinafter as saw lines 88.

In the illustrated embodiment, select pairs 90 of lines denoted by a dash-dot sequence represent the locations at which portions (discussed below) of a topmost wafer, i.e., either a sensor wafer or a cap wafer (discussed below) will be removed in order to access bond pads 42 (FIGS. 2 and 3) of the underlying wafer, which is the other of a sensor wafer or the cap wafer. These select pairs 90 are referred to hereinafter as saw-to-reveal lines 90. Sensor wafer structures 84 and 86 are illustrated as being generally disk-shaped. However, alternative embodiments of sensor wafer structures 84 and 86 may be any suitable shape, such as rectangular shaped. The quantity of sensor structures 22 or 72 that make up a given sensor wafer structure 84 or 86 varies depending upon the size of sensor structures 22 or 72 and upon the size of the wafers (discussed below) used to assemble sensor wafer structure 84 or 86.

Figure 6:
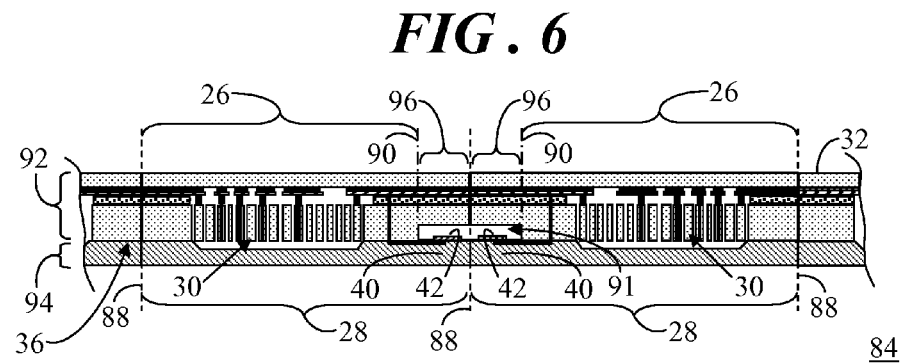
FIG. 6 shows a partial side view of the sensor wafer structure corresponding to the embodiment illustrated in FIG. 2.

Now referring to FIG. 6 in connection with activity 82 (FIG. 4), FIG. 6 shows a partial side view of sensor wafer structure 84 corresponding to the embodiment illustrated in FIG. 2. Sensor wafer structure 84 includes a sensor wafer 92, a cap wafer 94, and a plurality of sensors 30 formed on substrate material 32 of sensor wafer 92. In accordance with conventional and upcoming processes, sensor wafer 92 is fabricated to include sensors 30 and cap wafer 94 is separately fabricated. Cap wafer 94 is subsequently coupled to sensor wafer 92 using any suitable bonding technique and bonding material. Saw lines 88 delineate the boundaries of each adjacent sensor die 26. Likewise, saw lines 88 delineate the boundaries of each adjacent cap 28. Furthermore, a saw line 88 and an adjacent saw-to-reveal line 90 delineates a material section 96 of controller die 26 to be removed to expose the underlying bond pads 42 formed on substrate portion 40 of cap 28. In an embodiment, sensor wafer 92 may be suitably formed so that cavities 91, or spaces, extend inwardly from inner die surface 92 in which bond pads 42 reside. Such a configuration largely prevents damage to underlying structures on cap wafer 94 from the saw cut produced during a saw-to-reveal operation discussed below. In alternative configurations, underlying structures such as electrical connections could be buried in the substrate material of cap wafer 94 and electrically isolated from cap wafer 94, thus removing the need for cavities 91.

Figure 7:
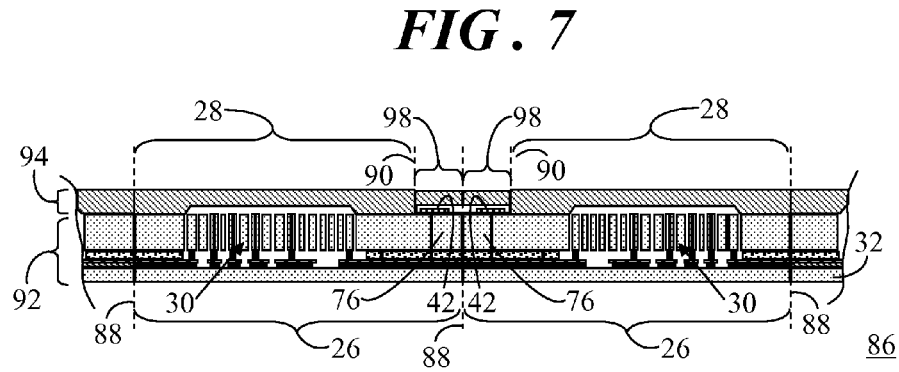
FIG. 7 shows a partial top view of another sensor wafer structure corresponding to the embodiment illustrated in FIG. 3.

Now referring to FIG. 7 in connection with activity 82 (FIG. 4), FIG. 7 shows a partial side view of sensor wafer structure 86 corresponding to the embodiment illustrated in FIG. 3. Sensor wafer structure 86 includes sensor wafer 92, cap wafer 94, and sensors 30 formed on substrate material 32. As described above, sensor wafer 92 is fabricated to include sensors 30 and cap wafer 94 is separately fabricated. Cap wafer 94 is subsequently coupled to sensor wafer 92 using any suitable bonding technique and bonding material. Saw lines 88 delineate the boundaries of each adjacent sensor die 26. Likewise, saw lines 88 delineate the boundaries of each adjacent cap 28. In this configuration, a saw line 88 and an adjacent saw-to-reveal line 90 delineates a material section 98 of cap 28 to be removed to expose the underlying bond pads 42 formed on substrate portion 76 of sensor die 26.

Referring back to FIG. 4, in response to activity 82, sensor wafer structure 84 (FIG. 6) or sensor wafer structure 86 (FIG. 7) is provided. Packaging process 80 will initially be discussed in connection with the provision of sensor wafer structure 84 to produce sensor packages 20 (FIG. 2).

Following activity 82, packaging process 80 continues with an activity 100. At activity 100, at least one controller element is provided. The controller element may be provided from a device manufacturer and packaged in accordance with packaging process 80 at a separate packaging facility. Alternatively, the controller element may be fabricated and packaged within the same manufacturing facility.

Figure 8:
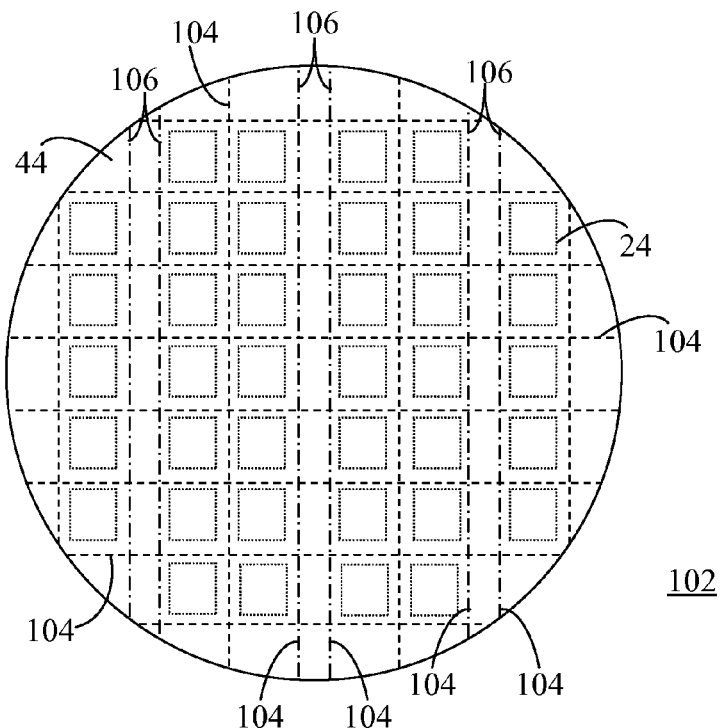
FIG. 8 shows a top view of a controller element, in the form of a controller wafer, used in connection with the packaging process.
Figure 9:
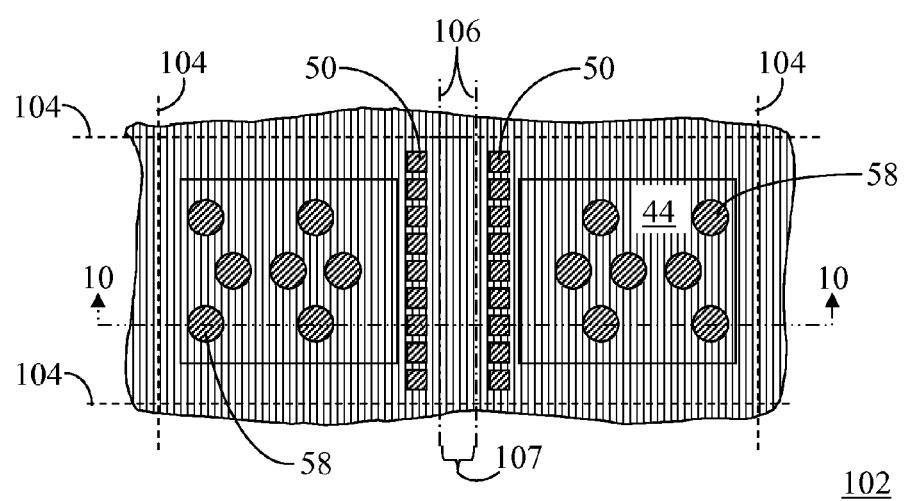
FIG. 9 shows an enlarged partial top view of the controller wafer.
Figure 10:
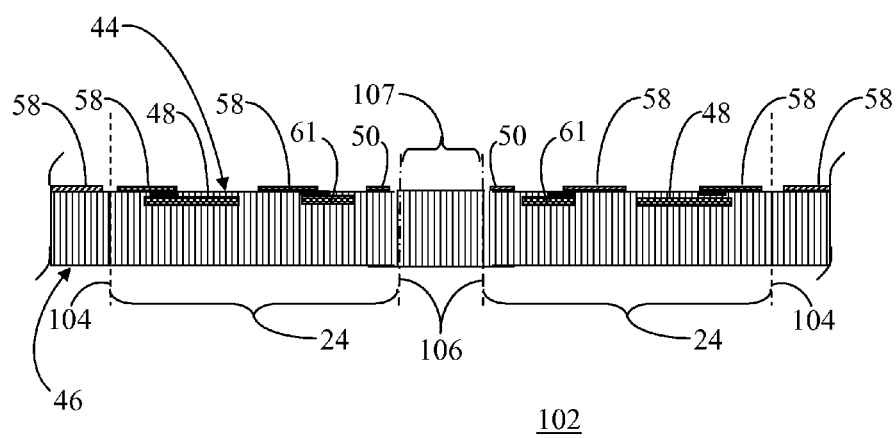
FIG. 10 shows a partial side sectional view of the controller wafer along section lines 10-10 of FIG. 9.

Referring to FIGS. 8-10 in connection with activity 82, FIG. 8 shows a top view of a controller element in the form of a controller wafer 102 used in connection with packaging process 80. FIG. 9 shows an enlarged partial top view of controller wafer 102, and FIG. 10 shows a partial side sectional view of controller wafer 102 along section lines 10-10 of FIG. 9. Controller wafer 102 has top side 44 and bottom side 46, in which top side 44 includes a plurality of controller dies 24, and each of controller dies includes control circuitry 48 and, in some embodiments, integral sensor 61.

Controller wafer 102 may be manufactured utilizing conventional and upcoming integrated circuit (IC) fabrication techniques for forming control circuitry 48 in the active regions of controller wafer 102. The implementation of standard IC wafer fabrication techniques creates transistors, capacitors, resistors, diodes, and all other components of control circuitry 48 and, if present, integral sensor 61. In addition, these IC fabrication techniques may be implemented to form bond pads 50 and bumps pads 58 at top side 44 of controller wafer 102. These conventional process steps need not be described herein.

Top side 44 of controller wafer 102 is marked with dashed lines 104 along the generally planar top side 44 of controller wafer 102. Dashed lines 104 represent the locations at which controller wafer 102 will be sawn or diced. For example, in the illustrated embodiment, adjacent pairs 106 of vertically arranged dashed lines 104 denoted by a dash-dot sequence represent the locations at which material sections 107 (discussed below) of controller wafer 102 may be removed in order to access the underlying sensor wafer structure 84 (FIG. 6). These adjacent pairs of lines are collectively referred to herein as saw-to-reveal lines 106. The remaining dashed lines 104 represent the locations at which controller wafer 102 will eventually be singulated (discussed below) concurrent with singulation of sensor wafer structure 84. Dashed lines 104 are collectively referred to herein as saw lines 104.

Controller wafer 102 is illustrated as being generally disk-shaped to correspond with sensor wafer structure 84 (FIG. 6). However, alternative embodiments of controller wafer 102 may be any suitable shape, such as rectangular shaped. Additionally, the quantity of controller dies 24 formed on a given controller wafer 102 varies depending upon the size of controller dies 24 and upon the size of controller wafer 102.

Figure 11:
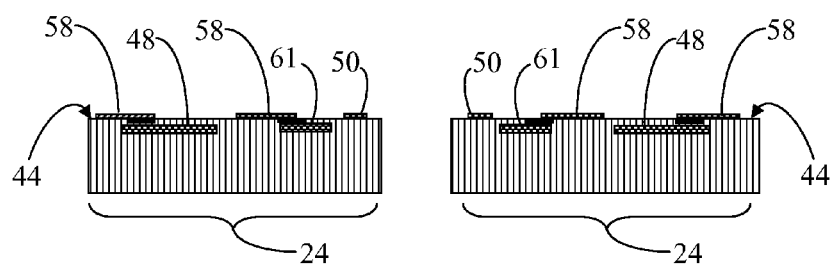
FIG. 11 shows a side view of a controller element, in the form of a plurality of separate controller dies, used in connection with the packaging process in accordance with another embodiment.

Referring now to FIG. 11, FIG. 11 shows a side view of controller elements, in the form of a controller dies 24, that may be used in connection with packaging process 80 in accordance with another embodiment. Packaging process 80 (FIG. 3) is embodied as a wafer-to-wafer fabrication process where the provided controller element is controller wafer 102 (FIG. 10), which will first be discussed in connection with FIGS. 12-18. In an alternative embodiment, packaging process 80 may be embodied as a die-to-wafer fabrication process where the provided at least one controller element is a plurality of controller dies 24, as will be discussed in connection with FIGS. 19-24. As such, FIG. 11 shows controller dies 24 after controller wafer 102 (FIG. 8) has been diced, sawn, etched, or otherwise singulated to form multiple controller dies 24 that are physically detached from one another.

Returning now to packaging process 80, following activity 100, packaging process 80 continues with an activity 108. At activity 108, controller wafer 102 (FIG. 8) undergoes a backgrinding process to thin wafer 102. In particular, bottom side 46 (FIG. 10) undergoes backgrinding, also referred to as wafer thinning, using a conventional abrasive material and equipment.

Figure 12:
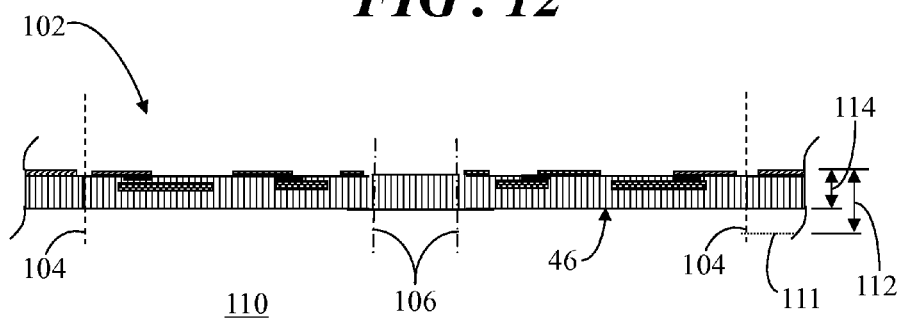
FIG. 12 shows a partial side sectional view of the controller wafer at an initial stage of packaging in accordance with the packaging process.

Referring to FIG. 12 in connection with activity 108, FIG. 12 shows a partial side sectional view of controller wafer 102 at an initial stage 110 of packaging in accordance with packaging process 80. As represented in FIG. 12 by a dotted line 111, controller wafer 102 exhibits an initial thickness 112 when it is provided for packaging at task 100 (FIG. 4). Initial thickness 112 of controller wafer 102 may be roughly seven hundred fifty microns thick. Wafer backgrinding is a semiconductor device fabrication operation in which wafer thickness is reduced to enable stacking and high density packaging of semiconductor devices. As further shown in FIG. 12, a final thickness 114 of controller wafer 102 following execution of backgrinding activity 108 is less than initial thickness 112. Final thickness 114 can be any suitable dimension that is as thin as possible without unduly sacrificing mechanical stability. For example, final thickness 114 of controller wafer 102 may be roughly one hundred microns.

Referring back to FIG. 4, following backgrinding activity 108, packaging process 80 continues with an activity 116. At activity 116, controller wafer 102 is bonded to sensor wafer structure 84 to form stacked wafer structure 55 (FIG. 2).

Figure 13:
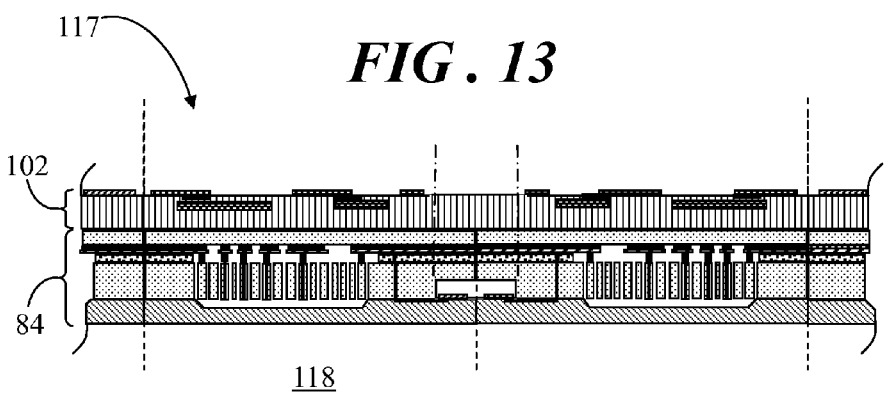
FIG. 13 shows a partial side sectional view of the controller wafer bonded to the sensor structure of FIG. 6 to form a stacked structure at a subsequent stage of packaging.

With reference to FIG. 13 in connection with activity 116, FIG. 13 shows a partial side sectional view of controller wafer 102 bonded to sensor wafer structure 84 to form a stacked wafer structure 117 at a subsequent stage 118 of packaging. Bonding may be performed utilizing direct bonding, adhesive bonding, thermocompression bonding, reactive bonding, plasma activated bonding, anodic bonding, eutectic bonding, or any other suitable bonding technique. For example, an epoxy die attach material or film may be utilized to bond controller wafer 102 to sensor wafer structure 84. In the embodiment shown, sensor wafer structure 84 is provided with sensor wafer 92 and cap wafer 94 bonded together prior to the bonding of controller wafer 102 to sensor wafer structure 84 to form a stacked wafer structure 117 at activity 116. However, in alternative embodiments, sensor wafer 92, cap wafer 94, and controller wafer 102 may be bonded together concurrently. In addition, note that when controller wafer 102 includes integral sensor 61 (FIG. 2), the temperature sensitivity of integral sensor 61 may limit the types of bonding materials and techniques utilized.

Alignment of controller wafer 102 with sensor wafer structure 84 may be achieved by utilizing mechanical or optical fiducial marks, such as notches at the edges of controller wafer 102 and sensor wafer structure 84, pins, etchings, or holographic images, among others. Automatic process equipment for silicon wafer bonding, as well as the integration of suitable alignment techniques, can provide precision location keyed to specific features on the semiconductor elements of controller wafer 102 and sensor wafer structure 84. Thus, angular alignment of less than one tenth of a degree of accuracy for the sensors may be achieved. This alignment accuracy is in contrast with the angular alignment of sensors achieved in traditional chip level die packaging, which is typically limited to approximately plus or minus two degrees of accuracy.

Referring back to FIG. 4, packaging process 80 continues with an activity 120 following bonding activity 116. At activity 120, conductive elements 60 (FIG. 2) are formed on bump pads 58 (FIG. 10) of controller wafer 102 (FIG. 10). In addition, an activity 122 of packaging process 80 may be performed. At activity 122, when the design configuration of sensor package 20 (FIG. 2) calls for sensor die 62 (FIG. 2), sensor dies 62 may be mounted to controller wafer 102 at suitable locations directly on controller dies 24 (FIG. 2) of controller wafer 82.

Figure 14:
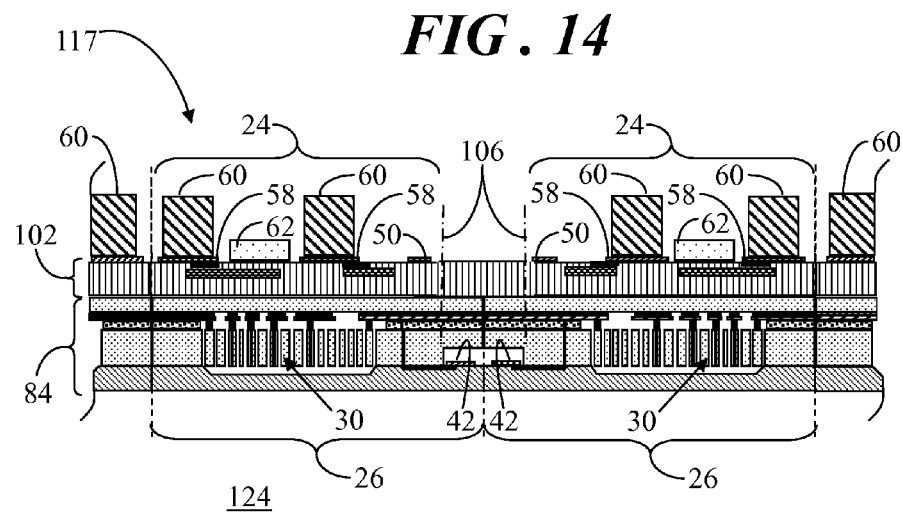
FIG. 14 shows a partial side sectional view of the stacked wafer structure of FIG. 13 at a subsequent stage of packaging.

Referring to FIG. 14 in connection with activities 120 and 122 of packaging process 80, FIG. 14 shows a partial side sectional view of stacked wafer structure 117 of FIG. 13 at a subsequent stage 124 of packaging. At activity 120, represented by FIG. 14, conductive elements 60 are formed on bump pads 58 of controller wafer 102. Conductive elements 60 may be copper pillars that are plated onto bump pads 58 of controller wafer 102. Alternatively, stud bumps or solder balls may be attached to bump pads 58 in accordance with conventional processes.

Conductive elements 60 are formed on bump pads 58 of the bonded wafers of stacked wafer structure 117 as a wafer-level process to achieve improvements in rotational accuracy of sensor package 20 (FIG. 2) to the product circuit. Formation of conductive elements 60 as a wafer-level process achieves accuracy improvements as compared with assembling a die into a sensor package, followed by assembling the sensor package into a product circuit. Accordingly, when sensor package 20 is eventually assembled to a product circuit by, for example, soldering, the location and rotation of sensor package 20 relative to the product circuit will be determined by the location and rotation of conductive elements 60 because the solder will align conductive elements 60 to the corresponding features on the product circuit.

At activity 122, also represented by FIG. 14, sensor dies 62 may be bonded to controller wafer 102 by a die attach process and wire bonded to controller wafer 102. Alternatively, sensor dies 62 may be mounted to controller wafer 102 utilizing a flip chip technique in which sensor dies 62 are inverted and connected directly to controller elements 24 using, for example, solder bump mounting, stud bump bonding, and the like, rather than a conventional wire bonding technique. Details of the die attach process and wire bonding of sensor dies 62 to controller wafer 102 are not illustrated herein for simplicity of illustration.

A flip chip technique may achieve good rotation and tilt accuracy between sensor dies 62 and sensors 30 of the underlying sensor wafer structure 84. However, even implementation of a die attach process may achieve improvements in alignment accuracy between sensor dies 62 and sensors 30 since each controller die 24 on controller wafer 102 is bonded to the underlying sensor wafer structure 84 containing sensors 30 with the excellent rotation and tilt accuracies achieved with wafer-to-wafer bonding. More critically, however, the mounting of sensor dies 62 onto controller wafer 102 can achieve improved package density.

With reference back to FIG. 4, packaging process 80 continues with an activity 126. At activity 126, material sections 107 (FIG. 10) of controller wafer 102 and material sections 96 (FIG. 6) of sensor wafer structure 84 are removed to reveal bond pads 42 (FIG. 2) on cap wafer 94 (FIG. 6).

Figure 15:
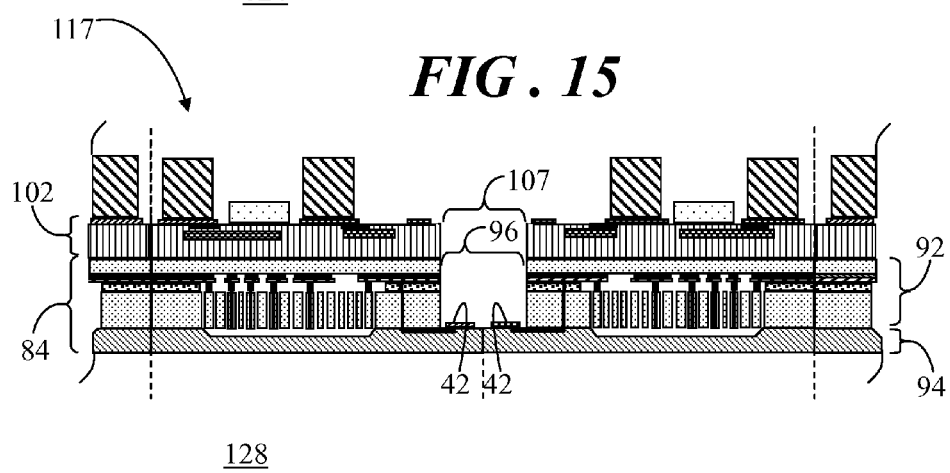
FIG. 15 shows a partial side sectional view of the stacked wafer structure of FIG. 14 at a subsequent stage of packaging.

Referring to FIG. 15 in connection with activity 126, FIG. 15 shows a partial side sectional view of stacked wafer structure 117 at a subsequent stage 128 of packaging. Referring momentarily back to FIG. 6, bond pads 42 reside in a cavity or space underlying material sections 96 of sensor wafer 92. As shown in FIG. 15, material sections 107 of controller wafer 102 and material sections 96 of sensor wafer 92 have been removed to expose, i.e., reveal, bond pads 42 residing in these cavities and formed on the underlying cap wafer 94. Material sections 107 and 96 may be removed by sawing along saw-to-reveal lines 106 in controller wafer 102 and saw-to-reveal lines 90 (see FIG. 6) in sensor wafer 92.

Again, referring back to FIG. 4, once material sections 107 and 96 have been removed to expose, i.e., reveal, bond pads 42 at activity 126, packaging process 80 continues with an activity 130. At activity 130, electrical interconnects in the form of bond wires 56 (FIG. 2) are attached between bond pads 42 (FIG. 2) of cap wafer 94 and bond pads 50 (FIG. 2) of controller wafer 102.

Referring now to FIG. 16 in connection with activity 130, FIG. 16 shows a partial side sectional view of stacked wafer structure 117 at a subsequent stage 132 of packaging. As shown, bond wires 56 are bonded to bond pads 42 on inner cap surface 34 of cap wafer 94 and to corresponding bond pads 50 on top side 44 of controller wafer 102 using a conventional wire bonding process. It should be observed that conductive elements 60 are higher than the wire bond loop height of bond wires 56. Wire bonding is a cost-effective and flexible interconnect technique, and can be readily implemented when forming electrical interconnects during a wafer-level fabrication process.

Referring back to FIG. 4, following wire bonding activity 130, packaging process 80 continues with an activity 134. At activity 134, packaging material 64 (FIG. 2) is applied to encapsulate stacked wafer structure 117.

With reference to FIG. 17 in connection with activity 134, FIG. 17 shows a partial side sectional view of stacked wafer structure 117 at a subsequent stage 136 of packaging. As shown in FIG. 17, conductive elements 60, top side 44 of controller wafer 102, sensor die 62, bond wires 56, and exposed inner cap surface 34 of cap wafer 94 are encapsulated with packaging material 64. Packaging material 64 may be mold compound, potting compound, epoxy resin, and so forth. Packaging material 64 is applied in a thick enough layer to cover bond wires 56 and conductive elements 60. If packaging material 64 entirely covers conductive elements 60 during encapsulation, packaging material 64 may be ground down or otherwise abraded to expose top surface 66 of conductive elements 60 without exposing bond wires 56.

As mentioned above, there may be variations in the order of operations in accordance with particular processing capabilities of a packaging facility. For example, conductive elements 60 may be formed after wirebonding (represented by FIG. 16) or after encapsulation (represented by FIG. 17), but prior to a singulation activity (discussed below).

Again referring back to FIG. 4, following wire bonding activity 130 and/or encapsulation activity 134, continued processing may be performed which is not shown herein for brevity. This continued processing may entail the addition of solder balls above conductive elements 60. The added solder balls can increase standoff and improve the electrical interconnection Additional continued processing may entail visual inspection, operational testing, burn-in, stress testing, accelerated life testing, the build-up of additional redistribution layers above packaging material 64 and top surface 66 of conductive elements 60, and so forth all while still at wafer level.

Following activity 134, an activity 138 is eventually performed. At activity 138, the fabricated stacked wafer structure 117 is singulated, i.e., cut, punched, or diced, in a conventional manner. Following activity 138, packaging process 80 ends.

Referring to FIG. 18 in connection with activity 138, FIG. 18 shows a side sectional view of sensor packages 20 produced from stacked wafer structure 117 (FIG. 17) in accordance with packaging process 80. As shown, stacked wafer structure 117 has been singulated, i.e., cut, punched, or diced, along saw lines that correspond with saw lines 88 (see FIG. 6) of sensor structure 22 and the remaining saw lines 104 (see FIG. 10) of controller wafer 102 to provide individual sensor packages 20. Following singulating activity 138, the individual sensor packages 20 can be coupled onto, for example, a printed circuit board in an end application. Each of the resulting sensor packages 20 represents a chip-scale package in which the x and y package dimensions are approximately equivalent to the x and y dimensions of sensor structure 22. However, the z dimension, i.e., the thickness, of each sensor package 20 may be approximately one hundred to two hundred microns larger than the thickness of the stacked wafer structure in order to accommodate conductive elements 60 and bond wires 56.

Packaging process 80 was described above as a wafer-to-wafer packaging process utilizing, sensor wafer structure 84 (FIG. 6) and controller wafer 102 (FIG. 10) to produce sensor package 20. In accordance with an alternative embodiment, packaging process 80 is described below as a die-to-wafer packaging process utilizing sensor wafer structure 86 (FIG. 7) and the previously singulated, i.e., detached, controller dies 24 (FIG. 11) to produce sensor package 70 (FIG. 3). It should be readily understood, however, that packaging process 80 may be implemented as a wafer-to-wafer packaging process, utilizing wafer structure 86 and controller wafer 102 to produce sensor package 70. Likewise, packaging process 80 may be implemented as a die-to-wafer packaging process utilizing, sensor wafer structure 84 and the previously singulated, i.e., detached, controller dies 24 to produce sensor package 20. In each embodiment, improvements may be achieved in rotation and tilt accuracy relative to traditional chip level die packaging.

Figure 19:
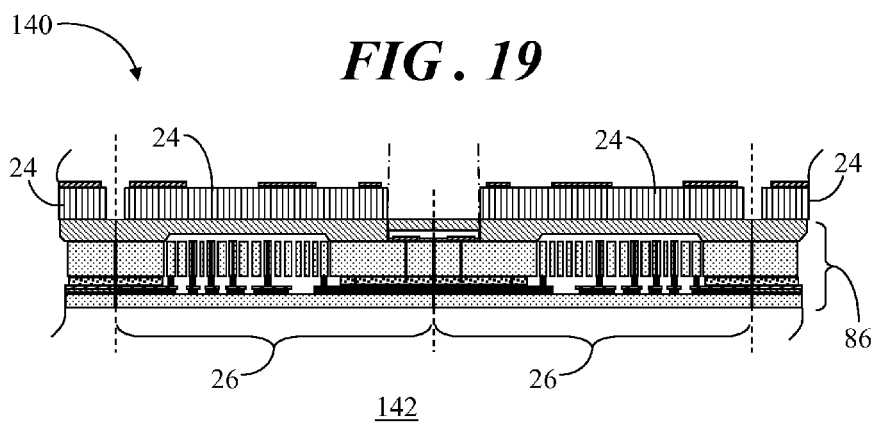
FIG. 19 shows a partial side sectional view of a controller element, in the form of controller dies, bonded to a sensor wafer structure to form a stacked structure 74 at an intermediate stage of packaging in accordance with the packaging process of FIG. 4.

FIG. 19 shows a partial side sectional view of a controller element, in the form of multiple controller dies 24, bonded to sensor wafer structure 86 to form a stacked wafer structure 140 at an intermediate stage 142 of packaging in accordance with bonding activity 116 (FIG. 4) of packaging process 80 (FIG. 4). By implementing a technique in which singulated controller dies 24 are attached to sensor wafer structure 86, the singulated controller dies 24 can be probed and tested prior to bonding at activity 116. Thus, only "good," (i.e., appropriately functioning) controller dies 24 will be bonded to sensor wafer structure 86. Additionally, since controller dies 24 are already singulated, i.e., physically detached from one another, the x and y dimensions of controller dies 24 can be different from the x and y dimensions of sensor dies 26.

Figure 20:
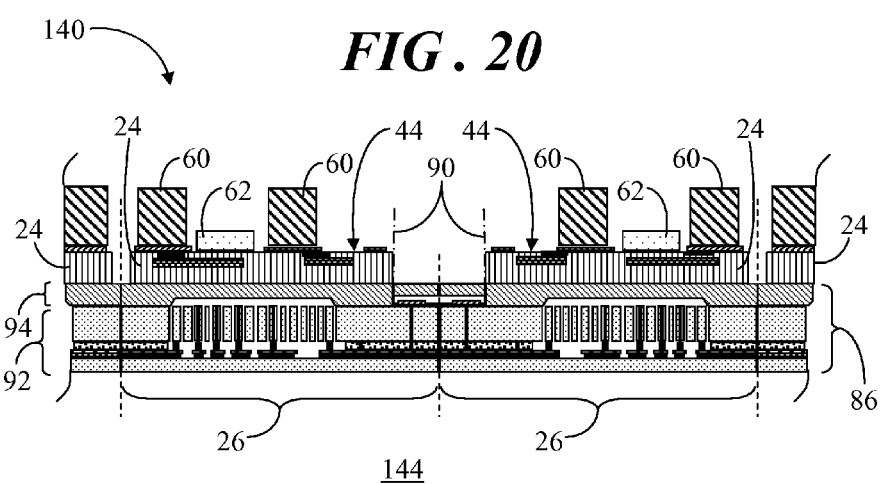
FIG. 20 shows a partial side sectional view of the stacked wafer structure of FIG. 19 at a subsequent stage of packaging.

FIG. 20 shows a partial side sectional view of stacked wafer structure 140 of FIG. 19 at a subsequent stage 144 of packaging in accordance with activities 120 and 122 (FIG. 4) of packaging process 80 (FIG. 4). Accordingly, at stage 144, conductive elements 60 are formed on bump pads 58 of controller dies 24. Additionally, sensor dies 62, if present, are mounted to top side 44 of controller dies 24.

Figure 21:
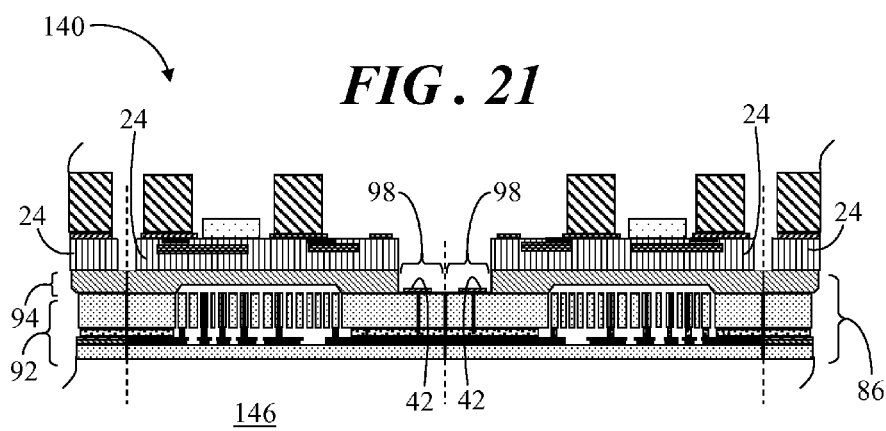
FIG. 21 shows a partial side sectional view of the stacked wafer structure of FIG. 20 at a subsequent stage of packaging.

FIG. 21 shows a partial side sectional view of stacked wafer structure 140 of FIG. 20 at a subsequent stage 146 of packaging in accordance with activity 126 (FIG. 4) of packaging process 80 (FIG. 4). At stage 146, material sections 98 of cap wafer 92 are removed to reveal bond pads 42 (FIG. 3) on the underlying sensor wafer 92. Material sections 98 may be removed by sawing along saw-to-reveal lines 90 (see FIG. 20) in cap wafer 94.

Figure 22:
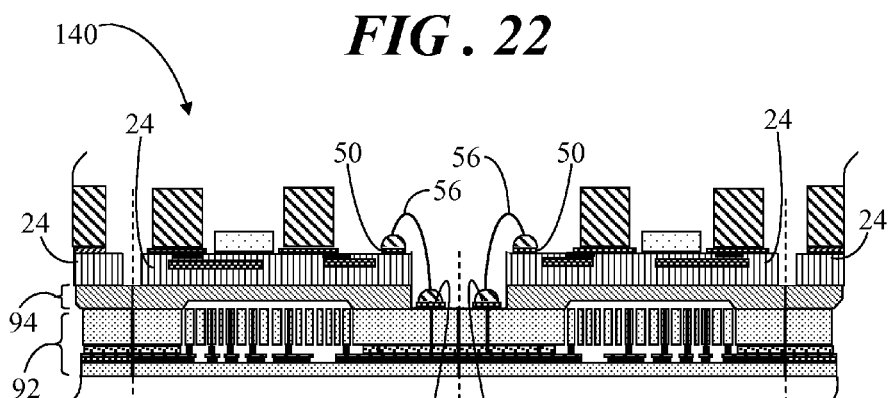
FIG. 22 shows a partial side sectional view of the stacked wafer structure of FIG. 21 at a subsequent stage of packaging.

FIG. 22 shows a partial side sectional view of stacked wafer structure 140 of FIG. 21 at a subsequent stage 148 of packaging in accordance with activity 130 (FIG. 4) of packaging process 80 (FIG. 4). At stage 148, electrical interconnects in the form of bond wires 56 are attached between bond pads 42 of sensor wafer 92 and corresponding bond pads 50 of each of controller dies 24.

Figure 23:
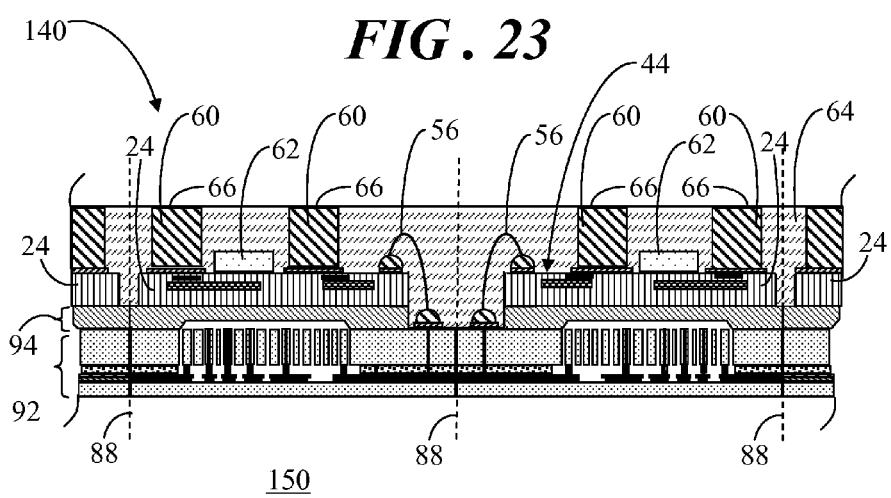
FIG. 23 shows a partial side sectional view of the stacked wafer structure of FIG. 22 at a subsequent stage of packaging.

FIG. 23 shows a partial side sectional view of stacked wafer structure 140 of FIG. 22 at a subsequent stage 150 of packaging in accordance with activity 134 (FIG. 4) of packaging process 80 (FIG. 4). At stage 150, packaging material 64 is applied to encapsulate stacked wafer structure 140. As shown in FIG. 23, conductive elements 60, top side 44 of controller dies 24, sensor die 62, bond wires 56, and exposed inner die surface 36 of sensor wafer 92 are encapsulated with packaging material 64. Again, if packaging material 64 entirely covers conductive elements 60 during encapsulation, packaging material 64 may be ground down or otherwise abraded to expose top surface 66 of conductive elements 60 without exposing bond wires 56.

Figure 24:
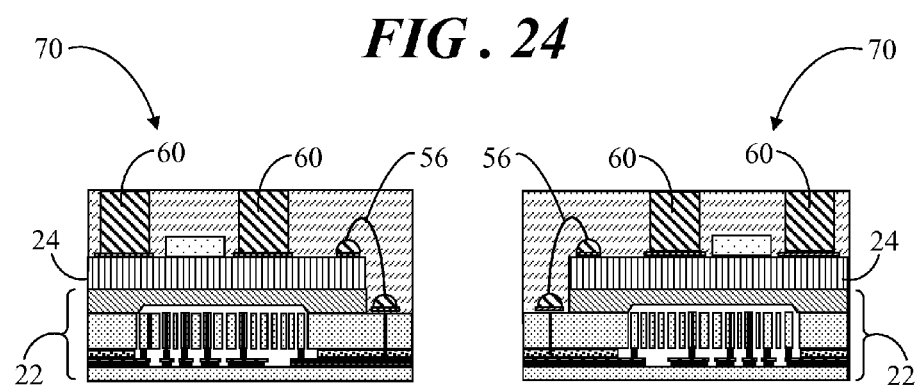
FIG. 24 shows a side sectional view of sensor packages produced from the stacked wafer structure of FIG. 23 in accordance with the packaging process of FIG. 4

FIG. 24 shows a side sectional view of sensor packages 70 produced from stacked wafer structure 140 of FIG. 23 following activity 138 (FIG. 4) of packaging process 80 (FIG. 4). That is, the fabricated stacked wafer structure 140 is singulated, i.e., cut, punched, or diced, in a conventional manner to yield sensor packages 70. For example, stacked wafer structure 140 has been singulated along saw lines 88 (see FIG. 8) of wafer structure 86 to provide individual sensor packages 70. Accordingly, each of the resulting sensor packages 70 represents a chip-scale package in which the x and y package dimensions are approximately equivalent to the x and y dimensions of sensor structure 22. However, the z dimension, i.e., the thickness, of each sensor package 70 may be approximately one hundred to two hundred microns larger than the thickness of stacked wafer structure 140 in order to accommodate conductive elements 60 and bond wires 56.

Embodiments described herein entail sensor packaging methodology and sensor packages produced in accordance with the packaging methodology. The packaging methodology involves a wafer-level packaging technique in lieu of traditional die placement techniques. In accordance with the wafer-level packaging technique, the controller wafer is bonded to a sensor wafer structure to form a stacked wafer structure with the active side of the controller wafer facing outwardly from the package. Thus, the package inputs and outputs can be formed on the controller wafer. A portion of the stacked wafer structure is sawn, etched, or otherwise cut to reveal the underlying bond pads of the sensor wafer structure and the corresponding bond pads for the controller dies on the controller wafer are wire bonded to the sensor bond pads in wafer format. The methodology is particularly useful when the sensor wafer structure includes a cap wafer bonded to a sensor wafer, and the bond pads for the sensor wafer structure are located on the cap wafer, rather than on the sensor wafer.

The wafer-level packaging process is especially suitable for the packaging of miniaturized sensors where precise rotation and tilt accuracy of the sensors can be achieved at the wafer level, rather than at the die level. Moreover, the required angular accuracy can be assured without more costly and time consuming testing. Accordingly, the wafer-level packaging process discussed herein provides high-throughput and precise placement packaging of sensors at relatively low cost. Moreover, the wafer-level packaging process results in individual sensor packages that are generally the same size as the sensor die, stacking of sensors and microelectronic devices for size reduction and improved package density, enhanced electrical performance, and so forth. Additionally, the wafer structure and corresponding methodology are cost-effective, readily implemented, and adaptable to existing assembly and packaging tools and techniques.

Although the preferred embodiments of the invention have been illustrated and described in detail, it will be readily apparent to those skilled in the art that various modifications may be made therein without departing from the spirit of the invention or from the scope of the appended claims. For example, the process operations following wafer bonding can be performed in a differing order than that which was presented.

What is claimed is:

1. A sensor package comprising:
   a sensor structure having a sensor die and a cap, said sensor die including a sensor, a first inner surface of said cap being coupled to a second inner surface of said sensor die, one of said cap and said sensor die including a substrate portion with first bond pads located on a corresponding one of said first and second inner surfaces, and a material section of the other one of said cap and sensor die being absent;
   a controller die having a top side and a bottom side opposing said top side, said top side including control circuitry and second bond pads, said bottom side being bonded to an outer surface of said sensor structure to form a stacked structure;
   a second sensor located at said top side of said controller die; and
   electrical interconnects attached between corresponding ones of said first bond pads and said second bond pads, said electrical interconnects being routed at least through a region where said material section is absent.

2. A sensor package as claimed in claim 1 wherein said outer surface of said sensor structure is a second outer surface of said sensor die, and said bottom side of said controller die is attached to said second outer surface of said sensor die to produce said stacked structure having said sensor die positioned between said cap and said controller die.

3. A sensor package as claimed in claim 2 wherein said cap includes said substrate portion with said first bond pads located on said first inner surface, and said first bond pads face in the same direction as said top side of said controller die.

4. A sensor package as claimed in claim 1 wherein said outer surface of said sensor structure is a first outer surface of said cap, and said bottom side of said controller die is attached to said first outer surface of said cap to produce said stacked structure having said cap positioned between said sensor die and said controller die.

5. A sensor package as claimed in claim 4 wherein said sensor die includes said substrate portion with said first bond pads located on said second inner surface, and said first bond pads face in the same direction as said top side of said controller die.

6. A sensor package as claimed in claim 1 further wherein said controller die includes bump pads formed on said top side of said controller die, and said sensor package further comprises conductive elements formed on and extending above said bump pads.

7. A sensor package as claimed in claim 1 further comprising a packaging material located over said top side of said controller die and encapsulating said control circuitry and said electrical interconnects.

8. A sensor package as claimed in claim 7 further comprising conductive elements extending above said top side of said controller die, said conductive elements being electrically connected with said controller die, and said conductive elements having a top surface that is exposed from said packaging material.

9. A sensor package comprising:
   a sensor structure having a sensor die and a cap, said sensor die including a sensor, a first inner surface of said cap being coupled to a second inner surface of said sensor die, one of said cap and said sensor die including a substrate portion with first bond pads located on a corresponding one of said first and second inner surfaces, and a material section of the other one of said cap and sensor die being absent;
   a controller die having a top side and a bottom side opposing said top side, said top side including control circuitry and second bond pads, said bottom side being bonded to an outer surface of said sensor structure to form a stacked structure;
   an integral sensor formed within said controller die; and
   electrical interconnects attached between corresponding ones of said first bond pads and said second bond pads, said electrical interconnects being routed at least through a region where said material section is absent.

10. A sensor package comprising:
    a sensor structure having a sensor die and a cap, said sensor die including a sensor, a first inner surface of said cap being coupled to a second inner surface of said sensor die, one of said cap and said sensor die including a substrate portion with first bond pads located on a corresponding one of said first and second inner surfaces, and a material section of the other one of said cap and sensor die being absent;

a controller die having a top side and a bottom side opposing said top side, said top side including control circuitry and second bond pads, said bottom side being bonded to an outer surface of said sensor structure to form a stacked structure, said controller die including bump pads formed on said top side of said controller die;

conductive elements formed on said bump pads;

a second sensor located at said top side of said controller die; and electrical interconnects attached between corresponding ones of said first bond pads and said second bond pads, said electrical interconnects being routed at least through a region where said material section is absent.

11. A sensor package as claimed in claim 10 wherein said outer surface of said sensor structure is a second outer surface of said sensor die, and said bottom side of said controller die is attached to said second outer surface of said sensor die to produce said stacked structure having said sensor die positioned between said cap and said controller die.

12. A sensor package as claimed in claim 11 wherein said cap includes said substrate portion with said first bond pads located on said first inner surface, and said first bond pads face in the same direction as said top side of said controller die.

13. A sensor package as claimed in claim 10 wherein said outer surface of said sensor structure is a first outer surface of said cap, and said bottom side of said controller die is attached to said first outer surface of said cap to produce said stacked structure having said cap positioned between said sensor die and said controller die.

14. A sensor package as claimed in claim 13 wherein said sensor die includes said substrate portion with said first bond pads located on said second inner surface, and said first bond pads face in the same direction as said top side of said controller die.

15. A sensor package as claimed in claim 10 further comprising an integral sensor formed within said controller die.

16. A sensor package as claimed in claim 10 further comprising a packaging material located over said top side of said controller die and encapsulating said control circuitry, said electrical interconnects, and said second sensor, said packaging material additionally encapsulating a portion of said conductive elements such that a top surface of said conductive elements is exposed from said packaging material.

* * * * *